United States Patent
Chiba

(10) Patent No.: US 12,235,240 B2
(45) Date of Patent: Feb. 25, 2025

(54) MAGNETIC BODY INSPECTION APPARATUS AND MAGNETIC BODY INSPECTION METHOD

(71) Applicant: OSAKA UNIVERSITY, Osaka (JP)

(72) Inventor: Daichi Chiba, Osaka (JP)

(73) Assignee: OSAKA UNIVERSITY, Osaka (JP)

( * ) Notice: Subject to any disclaimer, the term of this patent is extended or adjusted under 35 U.S.C. 154(b) by 208 days.

(21) Appl. No.: 18/009,113

(22) PCT Filed: May 25, 2021

(86) PCT No.: PCT/JP2021/019773
§ 371 (c)(1),
(2) Date: Dec. 8, 2022

(87) PCT Pub. No.: WO2021/251129
PCT Pub. Date: Dec. 16, 2021

(65) Prior Publication Data
US 2023/0213480 A1    Jul. 6, 2023

(30) Foreign Application Priority Data

Jun. 9, 2020    (JP) ................ 2020-100072

(51) Int. Cl.
*G01N 27/82*    (2006.01)
*G01R 33/00*    (2006.01)
*G01R 33/07*    (2006.01)

(52) U.S. Cl.
CPC ......... *G01N 27/82* (2013.01); *G01R 33/0023* (2013.01); *G01R 33/072* (2013.01)

(58) Field of Classification Search
CPC ........ G01N 27/00; G01N 27/72; G01N 27/82; G01N 27/83; G01R 33/00; G01R 33/0023;
(Continued)

(56) References Cited

U.S. PATENT DOCUMENTS 5,128,613 A    7/1992  Takahashi
8,180,585 B2 *  5/2012  Cech .................. B60R 21/0136
                                                324/228
(Continued)

FOREIGN PATENT DOCUMENTS

CN    204255900        4/2015
CN    114072636 A  *  2/2022  ............. G01B 7/003
(Continued)

OTHER PUBLICATIONS

International Search Report (ISR) issued Aug. 17, 2021 in International (PCT) Application No. PCT/JP2021/019773.
(Continued)

*Primary Examiner* — Hoai-An D. Nguyen
(74) *Attorney, Agent, or Firm* — Wenderoth, Lind & Ponack, L.L.P.

(57) ABSTRACT

A magnetic body inspection method and magnetic body inspection apparatus (1) that has a magnet (10) and a magnetic sensor (20) that outputs electric signals. At least two electric signals are obtained by the magnetic sensor (20). A magnetic body present inside a nonmagnetic body can be detected non-destructively, by outputting the difference between the two obtained electric signals.

9 Claims, 4 Drawing Sheets

(58) Field of Classification Search
CPC ...... G01R 33/02; G01R 33/038; G01R 33/06;
G01R 33/07; G01R 33/072; G01R 33/09;
G01R 33/091
USPC .................................. 324/200, 228, 239, 240
See application file for complete search history.

(56) References Cited

U.S. PATENT DOCUMENTS

| | | |
|---|---|---|
| 2009/0058406 A1 | 3/2009 | Komori |
| 2020/0292498 A1 | 9/2020 | Oguchi et al. |
| 2022/0290965 A1* | 9/2022 | Ichinomiya .......... G01R 33/093 |

FOREIGN PATENT DOCUMENTS

| | | | | |
|---|---|---|---|---|
| JP | 62-6157 | 1/1987 | | |
| JP | 7-120558 | 5/1995 | | |
| JP | 2005-30872 | 2/2005 | | |
| JP | 2005-148049 | 6/2005 | | |
| JP | 2005-292111 | 10/2005 | | |
| JP | 2006-177747 | 7/2006 | | |
| JP | 2022069261 A * | 5/2022 | ............... | G01B 7/30 |
| WO | 2006/103910 | 10/2006 | | |
| WO | WO-2010117363 A1 * | 10/2010 | ............ | G01N 27/82 |
| WO | 2017/158898 | 9/2017 | | |

OTHER PUBLICATIONS

Notice of Reasons for Refusal issued Oct. 15, 2024 in Japanese Patent Application No. 2022-530110 with Machine translation.

* cited by examiner

[Fig.1]
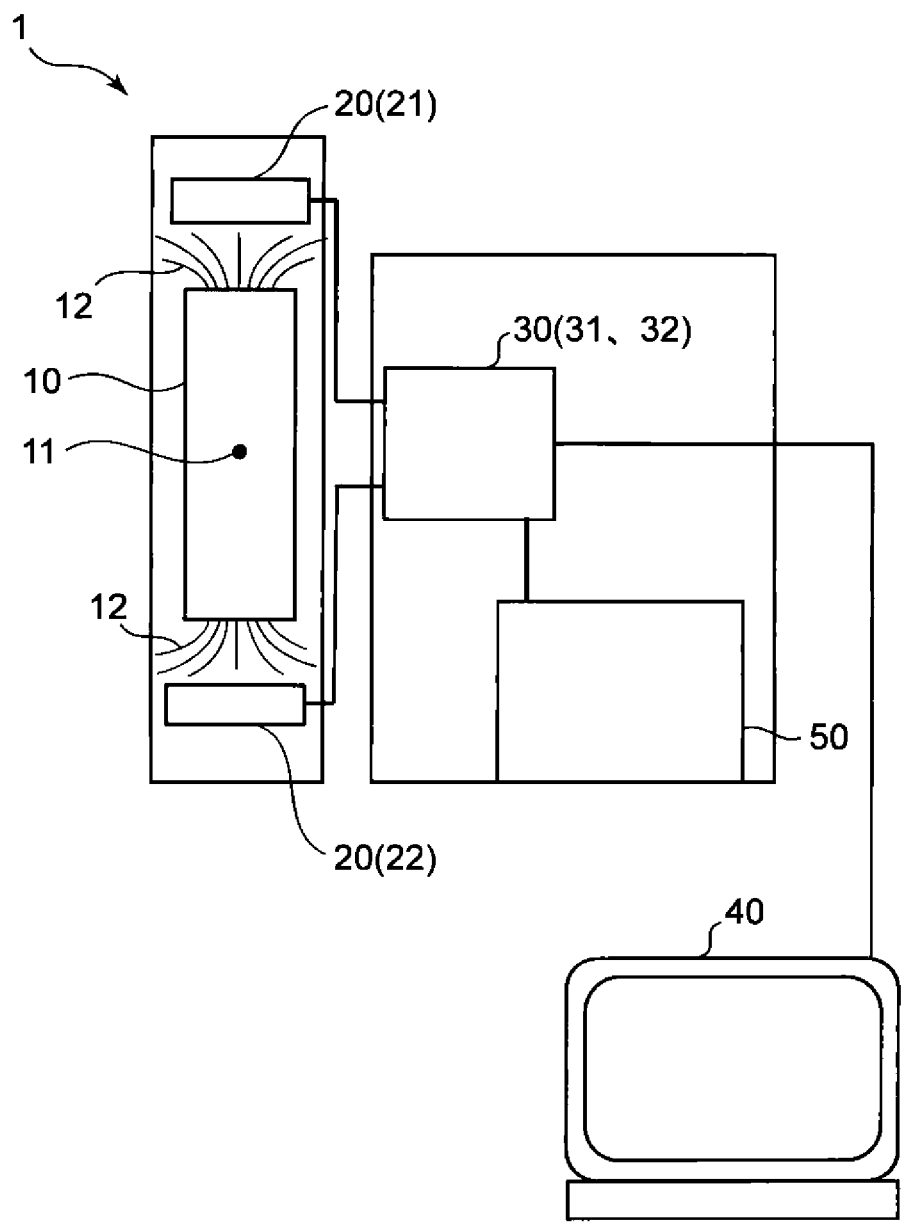

[Fig.2]
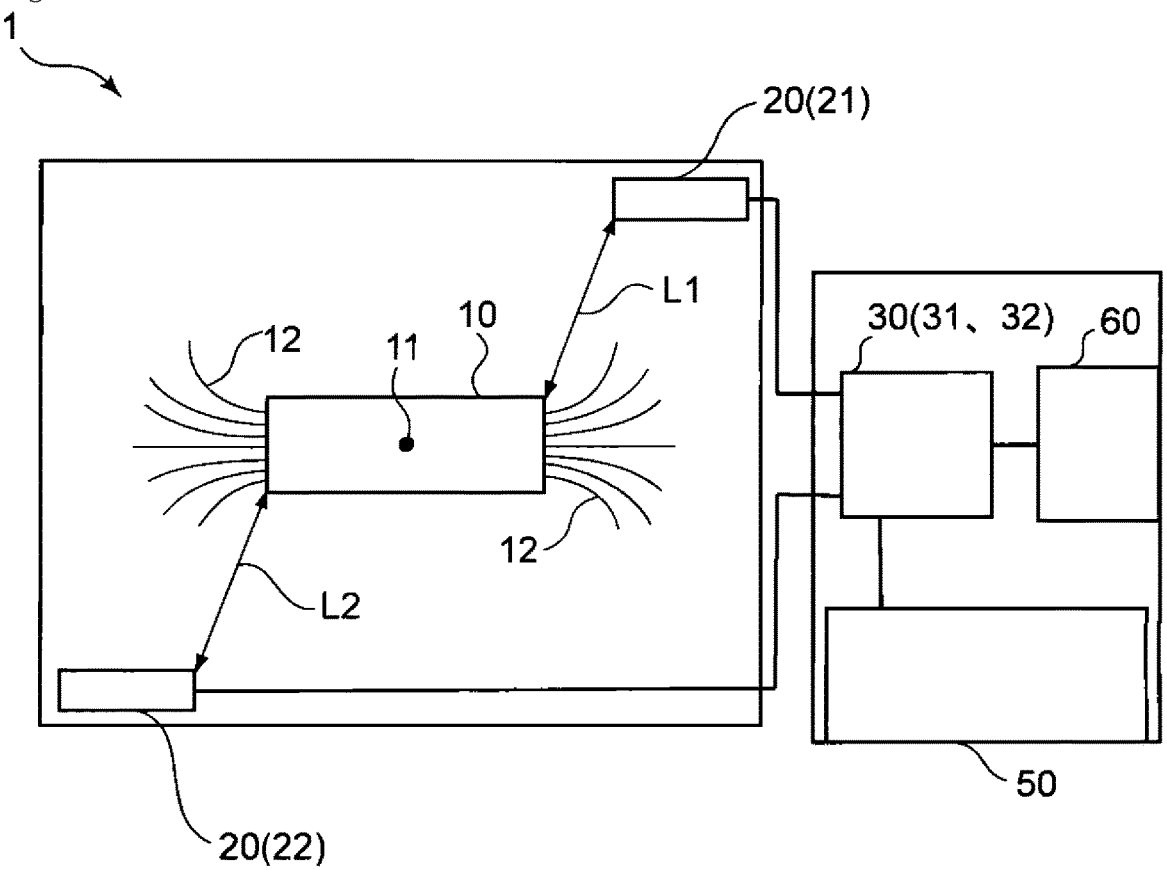

[Fig.3]
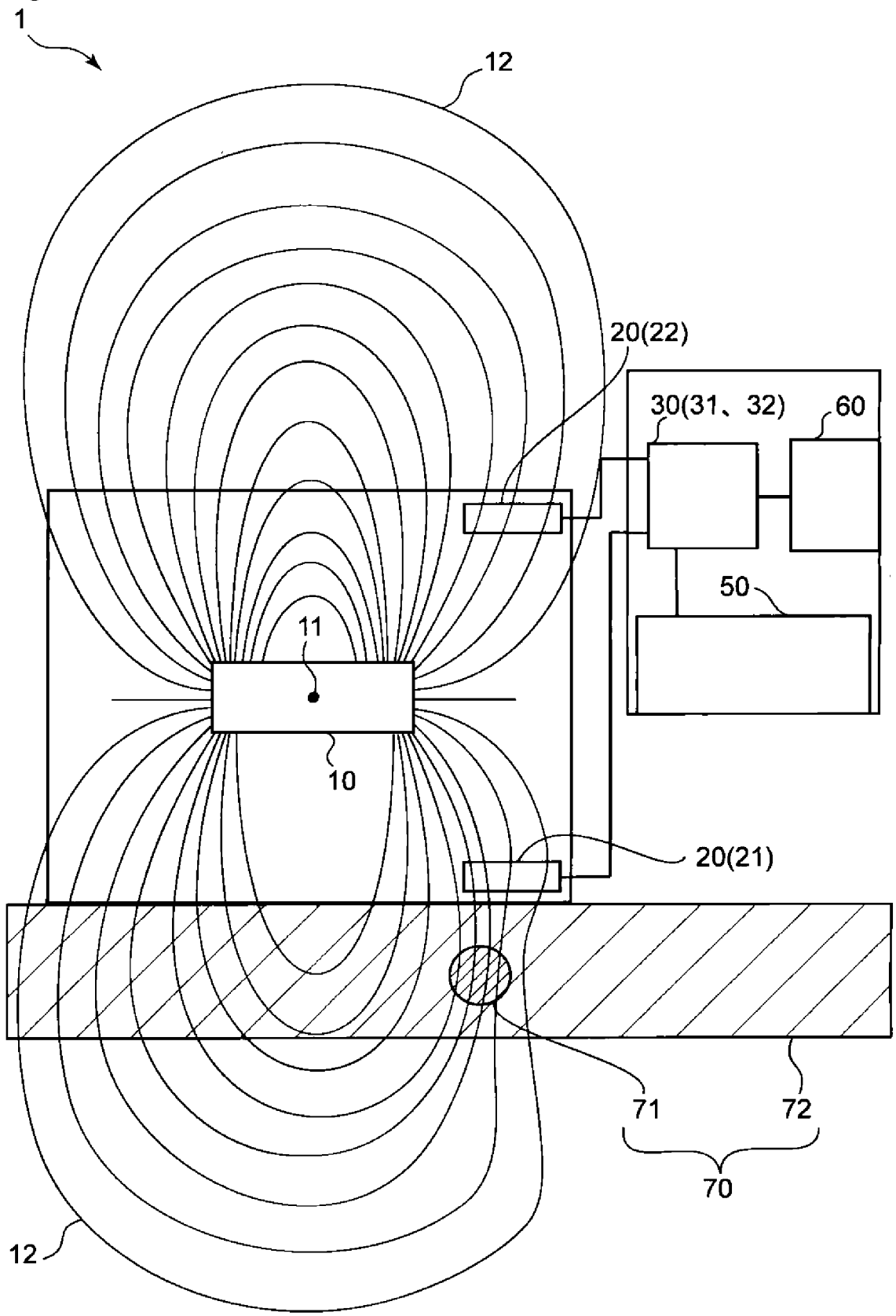

[Fig.4]
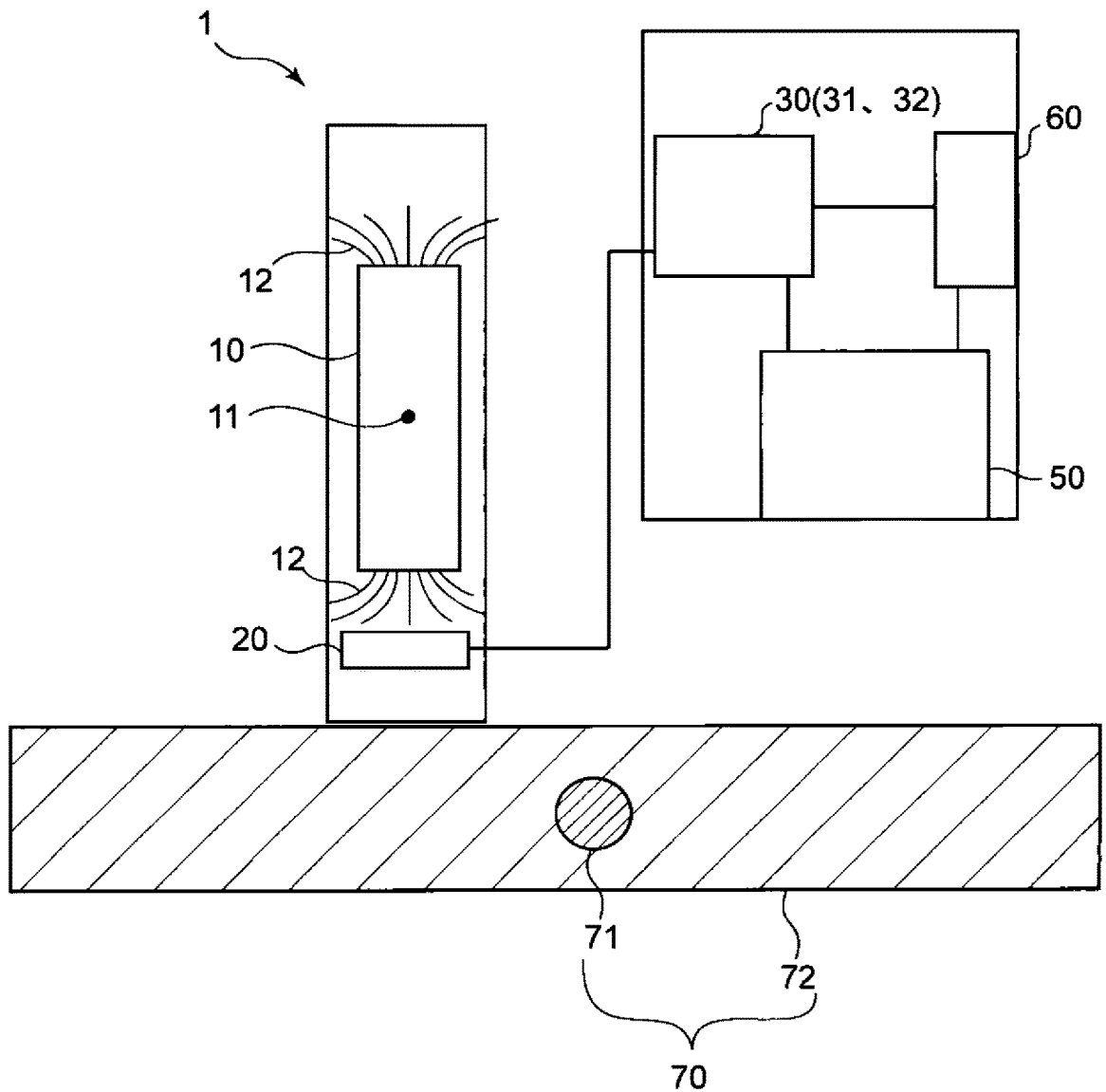

MAGNETIC BODY INSPECTION APPARATUS AND MAGNETIC BODY INSPECTION METHOD

TECHNICAL FIELD

The present invention relates to a magnetic body inspection apparatus for inspecting the position of a magnetic body existing inside a non-magnetic body such as a concrete structure, a heat insulating material, or a protective material, the presence or absence of breakage of a magnetic body, and a magnetic body inspection method.

BACKGROUND ART

Infrastructure and the like prepared during the high economic growth period have been deteriorating in recent years, and maintenance thereof has become an important issue. Such infrastructure and the like have been inspected in accordance with a method such as visual examination, tapping examination, or destructive inspection. There have been problems that it takes time for an inspector to learn such inspection technique, and that inspection accuracy depends on skill of the inspector. There have thus been demands for development of an inspection method and an inspection apparatus enabling reliable inspection, without being dependent on experiences and sense of the inspector. In particular, a reinforcing bar buried in a concrete structure cannot be visually checked, and there have accordingly been demands for a method and an apparatus enabling investigation of where the buried reinforcing bar is positioned and whether or not the reinforcing bar is broken, without destroying the concrete structure.

Examples of conventional technique include, as a method of inspecting a reinforcing bar buried in a concrete structure, a nondestructive inspection method of nondestructively analyzing a position or a corroded state of a magnetic body existing in a nonmagnetic structure, the nondestructive inspection method including magnetizing the magnetic body from outside the structure, and measuring, outside the structure, magnetic flux density of the magnetized magnetic body, to specify the position of the magnetic body or analyze the corroded state of the magnetic body (Patent Document 1).

The examples also include, as another method of inspecting a position, depth, or the like of a magnetic body, a reinforcing bar probing method with use of SQUID sensors, including aligning primary differentiation SQUID sensors perpendicularly to a reinforcing bar existing in a concrete structure, and scanning the sensors to measure primary differentiation in the perpendicular direction with respect to magnetic flux density of a direction component of the reinforcing bar, so as to measure a position or depth of the reinforcing bar (Patent Document 2).

However, the inspection method according to Patent Document 1 needs externally applying a strong magnetic field to the reinforcing bar to magnetize the reinforcing bar, having problems of needing such a strong magnetic field and exerting low inspection accuracy.

The inspection method according to Patent Document 2 enables measurement of a position, depth, or the like of a reinforcing bar, but is not practical for actual inspection of a reinforcing bar due to need for equipment configured to keep the SQUID sensors at low temperature.

RELATED ART DOCUMENTS

Patent Documents

Patent Document 1: PCT International Publication No. WO 2006/103910
Patent Document 2: JP-A-Hei-7-120558

SUMMARY OF THE INVENTION

Technical Problem

The present invention has been achieved in view of these circumstances, and it is an object of the present invention to provide a novel magnetic body inspection apparatus and a novel magnetic body inspection method for detection of a magnetic body existing in a nonmagnetic body such as a concrete structure, a heat insulating material, or a protective material.

Solutions to the Problems

The gist of one embodiment of a magnetic body inspection apparatus according to the present invention that can overcome the above problems is as follows. The magnetic body inspection apparatus comprising: a magnet; a first magnetic sensor disposed at a predetermined position relative to the magnet and configured to output an electric signal; and a second magnetic sensor disposed at a predetermined position relative to the magnet and configured to output an electric signal; the magnetic body inspection apparatus configured to output a difference between a first electric signal outputted from the first magnetic sensor and a second electric signal outputted from the second magnetic sensor. Outputting the difference between the first electric signal outputted from the first magnetic sensor and the second electric signal outputted from the second magnetic sensor enables detection of a magnetic body existing in a nonmagnetic body.

A distance between the first magnetic sensor and the magnet is preferably equal to a distance between the second magnetic sensor and the magnet.

The magnet is preferably a permanent magnet.

The magnetic sensor is preferably a Hall sensor.

The magnetic body inspection apparatus preferably further includes a differential amplifier circuit connected to the first magnetic sensor and the second magnetic sensor.

The magnetic body inspection apparatus is preferably used to inspect a reinforcing bar buried in a concrete structure.

The gist of one embodiment of a magnetic body inspection method according to the present invention that can overcome the above problems is as follows. The magnetic body inspection method executed with use of a magnetic body inspection apparatus including a magnet, a first magnetic sensor disposed at a predetermined position relative to the magnet and configured to output an electric signal, and a second magnetic sensor disposed at a predetermined position relative to the magnet and configured to output an electric signal, the magnetic body inspection method comprising: acquiring a first electric signal from the first magnetic sensor; acquiring a second electric signal from the second magnetic sensor; and outputting a difference between the first electric signal and the second electric signal. Outputting the difference between the first electric signal acquired from the first magnetic sensor and the second electric signal acquired from the second magnetic sensor enables detection of a magnetic body existing in a nonmagnetic body.

The gist of one embodiment of a magnetic body inspection method according to the present invention that can overcome the above problems is as follows. The magnetic body inspection method executed with use of a magnetic body inspection apparatus including a magnet, and a magnetic sensor configured to output an electric signal, the magnetic body inspection method comprising: a step T1 of acquiring an electric signal from the magnetic sensor in a state where a magnetic body exists as an inspection target; a step T2 of acquiring an electric signal from the magnetic sensor in a state where the magnetic body does not exist; and a step T3 of outputting a difference between the electric signal acquired in the step T1 and the electric signal acquired in the step T2. Outputting the difference between the electric signal acquired from the magnetic sensor in a state where the magnetic body exists and the electric signal acquired from the magnetic sensor in a state where the magnetic body does not exist enables detection of a magnetic body existing in a nonmagnetic body.

The gist of one embodiment of a magnetic body inspection method according to the present invention that can overcome the above problems is as follows. The magnetic body inspection method executed with use of a magnetic body inspection apparatus including a magnet, and a magnetic sensor configured to output an electric signal, the magnetic body inspection method comprising: acquiring an electric signal for a first spot from the magnetic sensor; shifting the magnetic sensor from the first spot to a second spot; acquiring an electric signal for the second spot from the magnetic sensor; and outputting a difference between the electric signal for the first spot and the electric signal for the second spot. Outputting the difference between the electric signal for the first spot and the electric signal for the second spot enables detection of a magnetic body existing in a nonmagnetic body.

Advantageous Effects of the Invention

The magnetic body inspection apparatus and the magnetic body inspection method according to the present invention enable detection of a magnetic body existing in a nonmagnetic body such as a concrete structure, a heat insulating material, or a protective material.

BRIEF DESCRIPTION OF THE DRAWINGS

FIG. 1 is a schematic view of an exemplary magnetic body inspection apparatus according to the embodiment of the present invention.

FIG. 2 is a schematic view of a magnetic body inspection apparatus according to a modification example of the embodiment of the present invention.

FIG. 3 is a schematic view of a magnetic body inspection apparatus according to a modification example of the embodiment of the present invention and a sectional view of an exemplary inspection target.

FIG. 4 is a schematic view of a magnetic body inspection apparatus according to a modification example of the embodiment of the present invention and a sectional view of an exemplary inspection target.

DESCRIPTION OF EMBODIMENTS

The present invention provides a magnetic body inspection apparatus including a magnet and a magnetic sensor configured to output an electric signal, and also provides a magnetic body inspection method. When the magnetic sensor acquires at least two electric signals and a difference between the two electric signals thus acquired is outputted, a magnetic body existing in a nonmagnetic body can be detected nondestructively.

The following is a specific description of the present invention with reference to the drawings. However, the prevent invention is not limited to the illustrated examples. It is also possible to implement the invention with appropriate changes to the extent that it can be adapted to the purpose of the preceding and following descriptions. All of these are included in the technical scope of the present invention.

The magnetic body inspection apparatus according to an embodiment of the present invention will be initially described with reference to FIGS. 1 and 2. FIG. 1 is a schematic view of an exemplary magnetic body inspection apparatus according to the embodiment of the present invention. FIG. 2 is a schematic view of a magnetic body inspection apparatus according to a modification example of the embodiment of the present invention.

As depicted in FIGS. 1 and 2, the magnetic body inspection apparatus according to the present invention is a magnetic body inspection apparatus 1 including: a magnet 10; a first magnetic sensor 21 disposed at a predetermined position relative to the magnet 10 and configured to output an electric signal; and a second magnetic sensor 22 disposed at a predetermined position relative to the magnet 10 and configured to output an electric signal. The magnetic body inspection apparatus is configured to output a difference between a first electric signal outputted from the first magnetic sensor 21 and a second electric signal outputted from the second magnetic sensor 22.

The magnet 10 included in the magnetic body inspection apparatus 1 has only to be configured to generate a magnetic field, and examples of the magnet include a permanent magnet and an electromagnet. The magnet 10 is preferably the permanent magnet because the permanent magnet is configured to stably generate a magnetic field from the permanent magnet itself, whereas the electromagnet needs electric power.

The magnet 10 is not particularly limited in terms of its shape, and can have any one of various shapes including a rectangular parallelepiped shape, a cubic shape, a quadrangular prism shape, a polygonal column shape, and a columnar shape.

The magnet 10 is not either particularly limited in the number thereof, and the magnetic body inspection apparatus 1 has only to include at least one magnet. There can be provided two, three, or more magnets 10 as necessary. A plurality of magnets 10 is preferably disposed at predetermined positions. Although the above mentions that the magnet 10 is preferably a permanent magnet, the magnet 10 may alternatively be an electromagnet, which can generate a stronger magnetic field than that generated by a permanent magnet. Such a stronger magnetic field enables detection of a magnetic body buried at a deeper position. When a plurality of electromagnets is provided, the electromagnets may be exemplarily disposed at predetermined positions. If some of the electromagnets are ON and the others are OFF, there can be formed a plurality of magnetic fields. There can thus be acquired a plurality of electric signals from a magnetic sensor 20, for higher specification accuracy of a position or a broken portion of a magnetic body existing in a nonmagnetic body.

The magnetic sensor 20 has only to be configured to measure magnitude of a magnetic field generated by a magnet. Examples of the magnetic sensor 20 included in the magnetic body inspection apparatus 1 include a Hall sensor configured to measure a magnetic field generated by a magnet or a magnetic field generated by current with reference to a Hall effect, and an MR sensor (magnetoresistance effect element) configured to measure magnitude of a magnetic field with reference to a magnetoresistance effect that a magnetic field varies electric resistance of a separate entity. A highly sensitive sensor such as the MR sensor has relatively larger output in comparison to the Hall sensor, so that the output is likely to saturate even when placed in a weak magnetic field. The magnetic sensor 20 in the magnetic body inspection apparatus 1 is disposed in a relatively strong magnetic field generated by the magnet 10. Accordingly, the magnetic sensor 20 is preferably a Hall sensor that does not cause saturation even in a relatively high magnetic field, or never generates a saturated magnetic field. Examples of the Hall sensor include a Hall element configured to output Hall voltage when current flows, and a Hall IC including the Hall element provided integrally with an operational amplifier configured to amplify a signal on a circuit. When the Hall element is adopted, which outputs relatively small voltage, the operational amplifier may be provided separately.

The Hall element includes first and second supply electrodes configured to supply current, and first and second measuring electrodes configured to measure voltage. Current flows in a constant direction (an x-axis direction) from the first supply electrode to the second supply electrode. A magnetic field is provided perpendicularly to the current flowing between the two supply electrodes (in a z-axis direction), charge particles carrying the current receive Lorentz force to be distorted in a direction (y-axis direction) perpendicular to a straight line (in the x-axis direction) connecting the two supply electrodes. This causes biased electric charge distribution in the y-axis direction, with a first side being positively electrified and a second side being negatively electrified. The first measuring electrode is disposed on the positively electrified side and the second measuring electrode is disposed on the negatively electrified side, to measure a potential difference between the two measuring electrodes. Measurement of the potential difference enables determination as to whether there is generated any magnetic field, and magnitude of the magnetic field.

Preferably, the magnet 10 is a permanent magnet and has a first direction from an S pole to an N pole, and the first and second measuring electrodes of the magnetic sensor 20 face each other in a second direction perpendicular to the first direction. Furthermore, the second direction in which the first and second measuring electrodes of each of the magnetic sensors 20 face each other is preferably perpendicular to a straight line connecting a gravity center of the first magnetic sensor 21 and a gravity center of the second magnetic sensor 22. Moreover, preferably, the first direction from the S pole to the N pole of the magnet 10 is perpendicular to the straight line connecting the gravity center of the first magnetic sensor 21 and the gravity center of the second magnetic sensor 22 as depicted in FIG. 3, or the first direction from the S pole to the N pole of the magnet 10 is parallel to the straight line connecting the gravity center of the first magnetic sensor 21 and the gravity center of the second magnetic sensor 22 as depicted in FIG. 1. In such a configuration, the magnetic sensors 20 are disposed such that a magnetic field 12 detected by the first magnetic sensor 21 is substantially equal in magnitude to a magnetic field 12 detected by the second magnetic sensor 22, so as to be suitable for output of the difference by the magnetic body inspection apparatus 1.

The magnetic sensor 20 outputs an electric signal. An electric signal is outputted in accordance with magnitude of a magnetic field detected by the magnetic sensor 20. For example, the magnetic field detected by the magnetic sensor 20 is converted to a signal of voltage, current, or the like according to the magnetic field so as to be outputted.

The magnetic body inspection apparatus 1 includes at least two magnetic sensors 20 including the first magnetic sensor 21 disposed at a predetermined position relative to the magnet 10 and configured to output an electric signal, and the second magnetic sensor 22 disposed at a predetermined position relative to the magnet 10 and configured to output an electric signal. The first magnetic sensor 21 disposed at a predetermined position relative to the magnet 10 has only to be positioned to detect the magnetic field 12 generated by the magnet 10. Similarly, the second magnetic sensor 22 disposed at a predetermined position relative to the magnet 10 has only to be positioned to detect the magnetic field 12 generated by the magnet 10.

In the magnetic body inspection apparatus 1, the magnetic sensors 20 are preferably disposed such that the magnetic field 12 detected by the first magnetic sensor 21 is substantially equal in magnitude to the magnetic field 12 detected by the second magnetic sensor 22. For example, as depicted in FIG. 2, a distance between the first magnetic sensor 21 and the magnet 10 is preferably equal to a distance between the second magnetic sensor 22 and the magnet 10. Assume that the distance between the first magnetic sensor 21 and the magnet 10 is obtained by measuring a distance between a closest portion of the first magnetic sensor 21 to the magnet 10 and a closest portion of the magnet 10 to the first magnetic sensor 21. Similarly, assume that the distance between the second magnetic sensor 22 and the magnet 10 is obtained by measuring a distance between a closest portion of the second magnetic sensor 22 to the magnet 10 and a closest portion of the magnet 10 to the second magnetic sensor 22. If the distance between the magnet 10 and the first magnetic sensor 21 is different from the distance between the magnet 10 and the second magnetic sensor 22, the first electric signal acquired from the first magnetic sensor 21 may be largely different in magnitude from the second electric signal acquired from the second magnetic sensor 22. However, the first electric signal is made similar in magnitude to the second electric signal by equalizing the distance between the first magnetic sensor 21 and the magnet 10 and the distance between the second magnetic sensor 22 and the magnet 10, for higher inspection accuracy.

Furthermore, as depicted in FIG. 2, a line segment L1 connecting the first magnetic sensor 21 and the magnet 10 is preferably parallel to a line segment L2 connecting the second magnetic sensor 22 and the magnet 10. More preferably, the distance between the first magnetic sensor 21 and the magnet 10 is equal to the distance between the second magnetic sensor 22 and the magnet 10, and the line segment L1 is parallel to the line segment L2. When the distance between the first magnetic sensor 21 and the magnet 10 is equal to the distance between the second magnetic sensor 22 and the magnet 10 and the line segment L1 is parallel to the line segment L2, the first magnetic sensor 21 and the second magnetic sensor 22 can detect magnetic fields more similar in magnitude, for higher inspection accuracy. The line segment L1 connecting the first magnetic sensor 21 and the magnet 10 and the line segment L2 connecting the second magnetic sensor 22 and the magnet 10 being parallel to each other indicates being positioned substantially within ±5 degrees from such a parallel state.

In the magnetic body inspection apparatus 1, the first magnetic sensor 21 and the second magnetic sensor 22 are preferably positioned such that magnetic force lines of the magnetic field detected by the first magnetic sensor 21 are symmetric in shape to magnetic force lines of the magnetic field detected by the second magnetic sensor 22. For example, as depicted in FIG. 1 or 2, the first magnetic sensor 21 and the second magnetic sensor 22 are preferably positioned symmetrically with respect to the magnet 10. The first magnetic sensor 21 and the second magnetic sensor 22 being positioned symmetrically with respect to the magnet 10 indicates being disposed point symmetrically about a gravity center 11 of the magnet 10, or being disposed line symmetrically with respect to a predetermined straight line including the gravity center 11 of the magnet 10. When the first magnetic sensor 21 and the second magnetic sensor 22 are positioned as described above, the magnetic force lines of the magnetic field 12 generated by the magnet 10 and detected by the first magnetic sensor 21 are assumed to be identical or symmetric in shape to the magnetic force lines of the magnetic field 12 generated by the magnet 10 and detected by the second magnetic sensor 22. If the magnetic force lines of the magnetic field 12 detected by the first magnetic sensor 21 are not identical or symmetric in shape to the magnetic force lines of the magnetic field 12 detected by the second magnetic sensor 22, there needs calculation for correction in shape. However, when the magnetic force lines of the magnetic field 12 detected by the first magnetic sensor 21 are made identical or symmetric in shape to the magnetic force lines of the magnetic field 12 detected by the second magnetic sensor 22, there needs no such calculation for correction upon output of the difference between the first electric signal and the second electric signal. This enables reduction in processing and calculation necessary for output of the difference, for reduction in time necessary for inspection as well as for improvement in inspection accuracy.

The magnetic sensors 20 do not limitedly include two sensors, namely, the first magnetic sensor 21 and the second magnetic sensor 22. Though not depicted, the magnetic body inspection apparatus 1 may further include a third magnetic sensor disposed at a predetermined position relative to the magnet 10, and a fourth magnetic sensor disposed at a predetermined position relative to the magnet 10. In such an exemplary case of providing the third magnetic sensor and the fourth magnetic sensor, the third and fourth magnetic sensors may be positioned to detect magnetic fields 12 different in magnitude from the magnetic fields 12 detected by the first magnetic sensor 21 and the second magnetic sensor 22. The magnetic sensors can be disposed such that the magnetic field 12 detected by the third magnetic sensor is substantially equal in magnitude to the magnetic field 12 detected by the fourth magnetic sensor. In this case, the magnetic body inspection apparatus can be configured to output a difference between a third electric signal outputted from the third magnetic sensor and a fourth electric signal outputted from the fourth magnetic sensor. Increase in the number of the magnetic sensors 20 in the magnetic body inspection apparatus 1 leads to higher inspection accuracy.

The magnetic body inspection apparatus 1 outputs the difference between the first electric signal outputted from the first magnetic sensor 21 and the second electric signal outputted from the second magnetic sensor 22.

As the magnetic body inspection apparatus 1 approaches a magnetic body, the difference between the first electric signal and the second electric signal varies. It can thus be identified that the magnetic body exists ahead of the magnetic body inspection apparatus 1 being approaching when the difference varies, achieving positional specification of the magnetic body existing in a nonmagnetic body. The magnetic field 12 of the magnet 10 concentratedly converges at an end of a magnetic body. A difference outputted at a broken portion of the magnetic body is thus more than a difference outputted at a position where an unbroken magnetic body exists. It is thus possible to identify breakage of the magnetic body at the position where the outputted difference is more than the difference at the position where the unbroken magnetic body exists.

As depicted in FIGS. 1 and 2, the magnetic body inspection apparatus 1 may include a difference detector 30 connected to the first magnetic sensor 21 and the second magnetic sensor 22, and the difference may be amplified when the difference detector 30 receives voltage output of the first electric signal and the second electric signal. As the difference detector 30 according to an embodiment, the magnetic body inspection apparatus 1 may further include a differential amplifier circuit 31 connected to the first magnetic sensor 21 and the second magnetic sensor 22, and the difference may be amplified and outputted simultaneously when the differential amplifier circuit 31 receives voltage output of the first electric signal and the second electric signal. As the difference detector 30 according to another embodiment, the magnetic body inspection apparatus 1 may further include an arithmetic processor 32 configured to convert an electric signal to a digital signal, and calculate a difference between digital signals, to amplify and output the difference. According to still another embodiment, as depicted in FIG. 1, the magnetic body inspection apparatus 1 may include a memory storing the first electric signal and the second electric signal, and a personal computer 40 or the like may acquire the first and second electric signals and a central processing unit (CPU) of the personal computer 40 is configured to calculate the difference between the signals so as to be outputted. The differential amplifier circuit 31 connected to the first magnetic sensor 21 and the second magnetic sensor 22 can be disposed close to the magnetic sensors for achievement of noise reduction. The magnetic body inspection apparatus 1 is thus preferred to further include the differential amplifier circuit 31 configured to receive voltage output of the first electric signal and the second electric signal.

As depicted in FIGS. 1 and 2, the magnetic body inspection apparatus 1 may include a power source unit 50 configured to adjust externally acquired electric power and supply the electric power thus adjusted into the apparatus. The power source unit 50 may include a power source switch configured to switch on or off electric power supply.

As depicted in FIG. 2, the magnetic body inspection apparatus 1 may include a display unit 60 configured to display, to a user, information on the difference between the first electric signal and the second electric signal. Examples of the display unit 60 can include a monitor configured to visualize magnitude of signals, magnitude of the difference, and the like.

As described above, the magnetic body inspection apparatus 1 according to the embodiment of the present invention outputs the difference between the first electric signal outputted from the first magnetic sensor 21 and the second electric signal outputted from the second magnetic sensor 22 to specify where a magnetic body exists in a nonmagnetic body, and whether or not the magnetic body is broken.

The magnetic body inspection apparatus 1 preferably includes the memory storing a database having gathered difference data acquired with use of a reference sample. The reference sample is a magnetic body having a thickness C1. For example, the difference between the first electric signal outputted from the first magnetic sensor 21 and the second electric signal outputted from the second magnetic sensor 22 is measured in a state where the reference sample and each of the magnetic sensors have a distance C2 therebetween, and the database has only to store the thickness C1 of the reference sample, the distance C2 between the reference sample and each of the magnetic sensors, and the difference associated with one another. C1 and C2 mentioned above are constants more than zero. C1 and C2 are preferably varied to obtain difference data for creation of the database.

In the magnetic body inspection apparatus 1 applied to an inspection target, the difference between the first electric signal outputted from the first magnetic sensor 21 and the second electric signal outputted from the second magnetic sensor 22 can be fitted with the difference data stored on the database. The thickness of the reference sample associated with the difference data on the database and the distance between the reference sample and each of the magnetic sensors can be obtained from a result of fitting between the difference obtained from the inspection target and the difference data on the database, so as to identify the thickness of the magnetic body as the inspection target and the distance between the magnetic body as the inspection target and the magnetic sensor. The difference between the first electric signal outputted from the first magnetic sensor 21 and the second electric signal outputted from the second magnetic sensor 22 is fitted with the difference data on the database as described above, so as to identify the thickness of the magnetic body as the inspection target as well as the distance between the magnetic body as the inspection target and each of the magnetic sensors. Fitting according to a different embodiment can be executed in accordance with a method with reference to a model function. There is prepared a model function F1 enabling database fitting, and the model function F1 is set such that fitting parameters D1 and D2 of the model function are determined uniquely with respect to C1 and C2. Furthermore, modeling is executed by preparing model functions F21 and F22 such that D1 and D2 become functions of C1 and C2, respectively. The inspection target is measured to obtain a result that is fitted to obtain the parameters D1 and D2. The parameters are inversely operated with reference to the model functions F21 and F22 to determine C1 and C2.

Furthermore, the magnetic body inspection apparatus 1 may be configured to identify a corroded portion in accordance with a difference obtained from the magnetic body as the inspection target, a distance between the magnetic body and a magnetic sensor, and thickness. More specifically, in a case where a reinforcing bar buried in a concrete structure is partially corroded to be radially reduced, the reinforcing bar includes a corroded portion and an uncorroded portion, which are assumed to have different numerical values of an obtained difference, thickness of the reinforcing bar, and a distance between the reinforcing bar and a magnetic sensor. As to the difference obtained from the magnetic body as the inspection target, the thickness, and the distance between the magnetic body and the magnetic sensor, if there is any portion having numerical values different from difference data, thickness of the magnetic body, and a distance between the magnetic body and the magnetic sensor of a peripheral portion, such a portion can be identified as being corroded.

Such fitting may be executed by an arithmetic processor or a controller optionally provided. The above provides the magnetic body inspection apparatus 1 including the memory storing the database. Alternatively, the database itself can be stored in a memory provided in a different device such as a memory provided to the personal computer or an externally provided memory.

The magnetic body inspection apparatus 1 is preferably used to inspect a reinforcing bar buried in a concrete structure. In a case where the reinforcing bar exists in the concrete structure, it is possible to specify where the reinforcing bar exists and whether or not the reinforcing bar is broken, without destroying the concrete structure. The concrete structure may have a buried tube or the like in addition to the reinforcing bar or a cavity. Obviously, neither the tube or the like as a nonmagnetic body nor the cavity is detected, so as to stably inspect only the reinforcing bar as the magnetic body. The inspection target of the magnetic body inspection apparatus 1 according to the embodiment of the present invention is not limited to a reinforcing bar but can be any magnetic body. The magnetic body inspection apparatus 1 achieves inspection also in a case where a plurality of magnetic bodies is arranged and in a case where magnetic bodies are arranged to form a grid pattern.

A preferred method of using the magnetic body inspection apparatus is specifically described next with reference to FIG. 3. FIG. 3 is a schematic view of the magnetic body inspection apparatus according to the modification example of the embodiment of the present invention and a sectional view of a concrete structure having a buried reinforcing bar serving as an exemplary inspection target.

The magnetic body inspection apparatus 1 is initially disposed on an inspection target 70 such that one of the magnetic sensors is positioned closer to the inspection target 70 than the magnet 10, as well as such that another one of the magnetic sensors is positioned farther from the inspection target 70 than the magnet 10. Assume that a distance from a magnetic sensor to the inspection target is obtained by measuring a distance between a closest portion of the magnetic sensor to the inspection target and a farthest portion of the inspection target from the magnetic sensor. Furthermore, assume that a distance from the magnet to the inspection target is obtained by measuring a distance between a closest portion of the magnet to the inspection target and a farthest portion of the inspection target from the magnet. Specifically, the magnetic body inspection apparatus 1 is disposed on the inspection target 70 such that the first magnetic sensor 21 is positioned closer to the inspection target 70 than the magnet 10, as well as such that the second magnetic sensor 22 is positioned farther from the inspection target 70 than the magnet 10. A surface of the inspection target 70 is scanned with the positional relation being kept among the magnet 10, the magnetic sensors 20, and the inspection target 70. The magnetic sensors 20 acquire electric signals while scanning. The magnetic field 12 of the magnet 10 is indicated by stable magnetic force lines without change if there is no magnetic body nearby (hereinafter, referred to as "reference magnetic force lines"). However, when there is any magnetic body near the magnet 10, the magnetic field 12 of the magnet 10 is indicated by magnetic force lines different from the reference magnetic force lines because the magnetic field 12 of the magnet 10 has a characteristic of converging at the magnetic body. At the first magnetic sensor 21 positioned closer to the inspection target 70 than the magnet 10, when the magnetic body exists in the inspection target 70, at least part of the magnetic field 12 converges at the magnetic body and the first magnetic sensor 21 having detected the magnetic field 12 outputs an electric signal according to the magnetic field (the first electric signal). In contrast, at the second magnetic sensor 22 positioned farther from the inspection target 70 than the magnet 10, the magnetic field 12 keeps lines similar to the reference magnetic force lines and the second magnetic sensor 22 outputs an electric signal according to the magnetic field 12 having lines similar to the reference magnetic force lines (the second electric signal). As the magnetic body inspection apparatus 1 thus configured approaches the magnetic body, the difference between the first electric signal and the second electric signal varies. It can thus be identified that the magnetic body exists ahead of the magnetic body inspection apparatus 1 being approaching when the difference varies. Accordingly, outputting the difference between the first electric signal and the second electric signal enables identifying where the magnetic body is buried. However, if the first magnetic sensor 21 and the second magnetic sensor 22 are not positioned such that the magnetic force lines of the magnetic field detected by the first magnetic sensor 21 are symmetric in shape to magnetic force lines of the magnetic field detected by the second magnetic sensor 22, calculation for correction according to the positions of the magnetic sensors 20 is needed before output of the difference between the two electric signals. Such calculation can be executed with use of an arithmetic processor or the like.

There has been described the magnetic body inspection apparatus according to the embodiment of the present invention. Described next is a magnetic body inspection method with use of the magnetic body inspection apparatus. The following description does not refer to the configurations having been described in the description of the magnetic body inspection apparatus.

Initially described with reference to FIG. 3 is a magnetic body inspection method according to a first embodiment.

The magnetic body inspection method according to the first embodiment of the present invention is executed with use of the magnetic body inspection apparatus 1 including the magnet 10, the first magnetic sensor 21 disposed at a predetermined position relative to the magnet 10 and configured to output an electric signal, and the second magnetic sensor 22 disposed at a predetermined position relative to the magnet 10 and configured to output an electric signal. The magnetic body inspection method includes: acquiring the first electric signal from the first magnetic sensor 21 (step S1); acquiring the second electric signal from the second magnetic sensor 22 (step S2); and outputting the difference between the first electric signal and the second electric signal (step S3).

Step S1 involves acquiring the first electric signal from the first magnetic sensor 21. More specifically, as depicted in FIG. 3, the first electric signal is preferably acquired from the first magnetic sensor 21 in a state where at least part of the magnetic field 12 of the magnet 10 converges at the magnetic body.

Step S2 involves acquiring the second electric signal from the second magnetic sensor 22. More specifically, as depicted in FIG. 3, the second electric signal is preferably acquired from the second magnetic sensor 22 in a state where the magnetic field 12 of the magnet 10 does not converge at the magnetic body. In the state where the magnetic field 12 of the magnet 10 does not converge at the magnetic body, the magnetic field 12 has the reference magnetic force lines.

Step S3 involves outputting the difference between the first electric signal acquired in step S1 and the second electric signal acquired in step S2.

The magnetic body inspection apparatus 1 used to execute the magnetic body inspection method has only to include two or more magnetic sensors. For example, according to the magnetic body inspection method with use of the magnetic body inspection apparatus 1 depicted in FIG. 3, the first magnetic sensor 21 measures the magnetic field 12 generated by the magnet 10 in a state where a reinforcing bar 71 exists in the inspection target 70 in step S1, and the second magnetic sensor 22 measures the magnetic field 12 generated by the magnet 10 in a state where the reinforcing bar 71 does not exist in the inspection target 70 in step S2. Subsequently executed is step S3 of outputting the difference between the first electric signal acquired from the first magnetic sensor 21 in step S1 and the second electric signal acquired from the second magnetic sensor 22 in step S2. Although step S1 may be executed prior to step S2 or step 2 may be executed prior to step 1, step S1 and step S2 are preferably executed simultaneously. Simultaneously executing step S1 and step S2 shortens time necessary for inspection of the magnetic body.

The magnetic body inspection method preferably includes amplifying the difference between the first electric signal acquired from the first magnetic sensor 21 in step S1 and the second electric signal acquired from the second magnetic sensor 22 in step S2 (step S4). For example, step S4 of amplifying the difference can be executed prior to step S3. That is, the difference between the first electric signal acquired from the first magnetic sensor 21 in step S1 and the second electric signal acquired from the second magnetic sensor 22 in step S2 can be amplified and then outputted. For example in this case, the magnetic body inspection apparatus 1 can include the arithmetic processor 32 functioning as the difference detector 30, such that the arithmetic processor 32 converts, to digital signals, the first electric signal acquired from the first magnetic sensor 21 in step S1 and the second electric signal acquired from the second magnetic sensor 22 in step S2, to calculate and amplify the difference between the digital signals. According to a different embodiment, step S4 of amplifying the difference can be executed simultaneously with step S3. That is, the difference between the first electric signal acquired from the first magnetic sensor 21 in step S1 and the second electric signal acquired from the second magnetic sensor 22 in step S2 can be amplified and outputted simultaneously. This embodiment is preferred in that simultaneously executing step S4 and step S3 shortens time necessary for inspection. For example in this case, the magnetic body inspection apparatus 1 can include the differential amplifier circuit 31 functioning as the difference detector 30 and connected to the first magnetic sensor 21 and the second magnetic sensor 22, such that the first electric signal acquired from the first magnetic sensor 21 in step S1 and the second electric signal acquired from the second magnetic sensor 22 in step S2 are simultaneously transmitted to the differential amplifier circuit 31, and the difference between the two electric signals is amplified in accordance with a constant coefficient and outputted simultaneously. The differential amplifier circuit 31 connected to the first magnetic sensor 21 and the second magnetic sensor 22 can be disposed close to the magnetic sensors for achievement of noise reduction. In this manner, the magnetic body inspection method includes amplifying the difference between the first electric signal acquired from the first magnetic sensor 21 in step S1 and the second electric signal acquired from the second magnetic sensor 22 in step S2 (step S4), for higher accuracy in inspection of the magnetic body.

As described above, the magnetic body inspection method according to the first embodiment of the present invention includes outputting the difference between the first electric signal acquired from the first magnetic sensor 21 and the second electric signal acquired from the second magnetic sensor 22, to specify where a magnetic body exists in a nonmagnetic body, and whether or not the magnetic body is broken.

The magnetic body inspection method can include fitting the difference outputted in step S3 with the database stored in the memory included in the magnetic body inspection apparatus 1 (step S5). For example, the difference between the first electric signal outputted from the first magnetic sensor 21 and the second electric signal outputted from the second magnetic sensor 22 is measured for the reference sample in the state where the reference sample and each of the magnetic sensors have the distance C2 therebetween, and the database stored in the memory has only to store the thickness C1 of the reference sample, the distance C2 between the reference sample and each of the magnetic sensors, and the difference associated with one another. Step S5 involves fitting the difference between the first electric signal and the second electric signal acquired with use of the magnetic body inspection apparatus 1 actually applied to the inspection target, with the difference data on the database. The thickness of the reference sample and the distance between the reference sample and each of the magnetic sensors associated with the difference data on the database can be obtained from a result of fitting between the difference outputted with the difference data on the database in step 5. It is accordingly possible to identify the thickness of the magnetic body as the inspection target and the distance between the magnetic body as the inspection target and each of the magnetic sensors. As described above, the magnetic body inspection apparatus 1 includes the memory storing the database, and the magnetic body inspection method according to the first embodiment of the present invention includes outputting the difference (step S3) between the first electric signal acquired in step S1 and the second electric signal acquired in step S2, and fitting the difference (step S5) outputted in step S3 with the data stored on the database, to achieve identification of the thickness of the magnetic body as well as the distance between the magnetic body and each of the magnetic sensors. Fitting according to a different embodiment can be executed in accordance with a method with reference to a model function. There is prepared a model function F1 enabling database fitting, and the model function F1 is set such that fitting parameters D1 and D2 of the model function are determined uniquely with respect to C1 and C2. Furthermore, modeling is executed by preparing model functions F21 and F22 such that D1 and D2 become functions of C1 and C2, respectively. The inspection target is measured to obtain a result that is fitted to obtain the parameters D1 and D2. The parameters are inversely operated with reference to the model functions F21 and F22 to determine C1 and C2.

The magnetic body inspection method also achieves identification of a corroded portion in accordance with the difference obtained from the magnetic body as the inspection target, the distance between the magnetic body and the magnetic sensor, and the thickness. It is accordingly possible to identify the distance between the magnetic body and the magnetic sensor, the thickness of the magnetic body, a broken portion, as well as the corroded portion. Such fitting may be executed by an arithmetic processor or a controller additionally provided. The above provides the magnetic body inspection method of storing the database in the memory included in the magnetic body inspection apparatus 1. Alternatively, the database itself can be stored in a memory provided in a different device such as a memory provided to the personal computer or an externally provided memory.

As described above, the magnetic body inspection method according to the first embodiment of the present invention includes outputting the difference between the first electric signal acquired from the first magnetic sensor 21 and the second electric signal acquired from the second magnetic sensor 22, and fitting the difference with the database, to specify a position and thickness of a magnetic body existing in a nonmagnetic body, a distance between the magnetic body and each of the magnetic sensors, a corroded portion, and whether or not the magnetic body is broken.

Described next with reference to FIGS. 3 and 4 is a magnetic body inspection method according to a second embodiment of the present invention. FIG. 4 is another schematic view of the magnetic body inspection apparatus according to the modification example of the embodiment of the present invention and a sectional view of a concrete structure having a buried reinforcing bar serving as the exemplary inspection target.

The magnetic body inspection method according to the second embodiment of the present invention is executed with use of the magnetic body inspection apparatus 1 including the magnet 10, and the magnetic sensor 20 configured to output an electric signal. The magnetic body inspection method includes: step T1 of acquiring an electric signal from the magnetic sensor 20 in a state where a magnetic body exists as an inspection target; step T2 of acquiring an electric signal from the magnetic sensor 20 in a state where the magnetic body does not exist; and step T3 of outputting a difference between the electric signal acquired in step T1 and the electric signal acquired in step T2.

The electric signal acquired in step T1 is acquired in the state where the magnetic body exists as the inspection target. More specifically, the electric signal is acquired from the magnetic sensor 20 in the state where at least part of the magnetic field 12 of the magnet 10 converges at the magnetic body.

The electric signal acquired in step T2 is acquired in the state where the magnetic body as the inspection target does not exist. More specifically, the electric signal is acquired from the magnetic sensor 20 in the state where the magnetic field 12 of the magnet 10 does not converge at the magnetic body. In the state where the magnetic field 12 of the magnet 10 does not converge at the magnetic body, the magnetic field has the reference magnetic force lines.

Step T3 involves outputting the difference between the electric signal acquired in step T1 and the electric signal acquired in step T2.

The magnetic body inspection apparatus 1 used to execute the magnetic body inspection method has only to include one or more magnetic sensors. In the case where the magnetic body inspection apparatus 1 includes two or more magnetic sensors as depicted in FIG. 3, step T1 of acquiring an electric signal from one of the magnetic sensors 20 (21) can be executed in the state where the magnetic body exists, and step T2 of acquiring an electric signal from another one of the magnetic sensors 20 (22) can be executed in the state where the magnetic body does not exist. Alternatively, an electric signal may be acquired from one of the magnetic sensors 20 (21) in the state where the magnetic body exists (step T1), and an electric signal may be acquired from the magnetic sensor 20 (21) in the state where the magnetic body does not exist (step T2). In the case of executing step T1 of acquiring the electric signal from the one of the magnetic sensors 20 (21) in the state where the magnetic body exists and executing step T2 of acquiring the electric signal from the other one of the magnetic sensors 20 (22) in the state where the magnetic body does not exist, step T1 may be executed prior to step T2, step T2 may be executed prior to step T1, or step T1 and step T2 may be executed simultaneously. There can be a method with use of only one of the magnetic sensors even upon adopting the magnetic body inspection apparatus 1 including the two magnetic sensors as depicted in FIG. 3. For example, an electric signal can be acquired from one of the magnetic sensors 20 (21) in the state where the magnetic body exists, and an electric signal can be acquired from the magnetic sensor 20 (21) in the state where the magnetic body does not exist. In this case, step T1 may be executed prior to step T2, or step T2 may be executed prior to step T1. In a case where the magnetic body inspection apparatus 1 includes only one magnetic sensor 20 as depicted in FIG. 4, an electric signal can be acquired from the single magnetic sensor 20 in the state where the magnetic body exists (step T1), and an electric signal can also be acquired from the magnetic sensor 20 in the state where the magnetic body does not exist after the magnetic sensor 20 is shifted to a place where the magnetic body does not exist (step T2). Alternatively, an electric signal can be acquired from the single magnetic sensor 20 in the state where the magnetic body does not exist (step T2), and an electric signal can also be acquired from the magnetic sensor 20 in the state where the magnetic body exists after the magnetic sensor 20 is shifted to a place where the magnetic body exists (step T2).

The magnetic body inspection method preferably includes step T4 of amplifying the difference between the electric signal acquired from the magnetic sensor 20 in step T1 and the electric signal acquired from the magnetic sensor 20 in step T2. For example, step T4 of amplifying the difference can be executed prior to step T3. That is, the difference between the electric signal acquired from the magnetic sensor 20 in step T1 and the electric signal acquired from the magnetic sensor 20 in step T2 can be amplified and then outputted. For example in this case, the magnetic body inspection apparatus 1 can include the arithmetic processor 32 functioning as the difference detector 30, such that the arithmetic processor 32 converts, to digital signals, the electric signal acquired from the magnetic sensor 20 in step T1 and the electric signal acquired from the magnetic sensor 20 in step T2, to calculate and amplify the difference between the digital signals. According to a different embodiment, step T4 of amplifying the difference can be executed simultaneously with step T3. That is, the difference between the electric signal acquired from the magnetic sensor 20 in step T1 and the electric signal acquired from the magnetic sensor 20 in step T2 may be amplified and outputted simultaneously. This embodiment is preferred in that simultaneously executing step T4 and step T3 shortens time necessary for inspection. For example in this case, the magnetic body inspection apparatus 1 can include the differential amplifier circuit 31 functioning as the difference detector 30, such that the differential amplifier circuit 31 simultaneously receives the electric signal acquired from the magnetic sensor 20 in step T1 and the electric signal acquired from the magnetic sensor 20 in step T2, to amplify the difference between the signals in accordance with a constant coefficient and simultaneously output the difference thus amplified. In this manner, the magnetic body inspection method includes step T4 of amplifying the difference between the electric signal acquired from the magnetic sensor 20 in step T1 and the electric signal acquired from the magnetic sensor 20 in step T2, for higher accuracy in inspection of the magnetic body.

As described above, the magnetic body inspection method according to the second embodiment of the present invention includes acquiring the electric signal in the state where the magnetic body exists, acquiring the electric signal in the state where the magnetic body does not exist, and outputting the difference therebetween, to specify where a magnetic body exists in a nonmagnetic body, and whether or not the magnetic body is broken.

The magnetic body inspection method can include step T5 of fitting the difference between the electric signal outputted from the magnetic sensor 20 in the state where the magnetic body exists and the electric signal outputted from the magnetic sensor 20 in the state where the magnetic body does not exist, with the database stored in the memory included in the magnetic body inspection apparatus 1. For example, the difference between the electric signal outputted from the magnetic sensor 20 in the state where the magnetic body exits and the electric signal outputted from the magnetic sensor 20 in the state where the magnetic body does not exist is measured when the reference sample and the magnetic sensor have the distance C2 therebetween, and the database stored in the memory has only to store the thickness C1 of the reference sample, the distance C2 between the reference sample and the magnetic sensor, and the difference associated with one another. Step T5 involves fitting the difference between the electric signal acquired in step T1 and the electric signal acquired in step T2 with use of the magnetic body inspection apparatus 1 actually applied to the inspection target, with the database stored in the memory. The thickness of the reference sample and the distance between the reference sample and the magnetic sensor associated with the difference data on the database can be obtained from a result of fitting between the difference and the database in step T5, so as to identify the thickness of the magnetic body existing in the inspection target and the distance between the magnetic body and the magnetic sensor. Fitting according to a different embodiment can be executed in accordance with a method with reference to a model function. There is prepared a model function F1 enabling database fitting, and the model function F1 is set such that fitting parameters D1 and D2 of the model function are determined uniquely with respect to C1 and C2. Furthermore, modeling is executed by preparing model functions F21 and F22 such that D1 and D2 become functions of C1 and C2, respectively. The inspection target is measured to obtain a result that is fitted to obtain the parameters D1 and D2. The parameters are inversely operated with reference to the model functions F21 and F22 to determine C1 and C2. Such fitting may be executed by an arithmetic processor or a controller further included in the magnetic body inspection apparatus 1.

As described above, the magnetic body inspection method according to the second embodiment of the present invention includes outputting the difference between the electric signal acquired in the state where the magnetic body exists and the electric signal acquired in the state where the magnetic body does not exist, and fitting the difference with the database, to specify a position and thickness of the magnetic body existing in a nonmagnetic body, a distance between the magnetic body and the magnetic sensor, and whether or not the magnetic body is broken.

The magnetic body inspection method also achieves identification of a corroded portion in accordance with the difference obtained from the magnetic body as the inspection target, the distance between the magnetic body and the magnetic sensor, and the thickness. It is accordingly possible to identify the distance between the magnetic body and the magnetic sensor, the thickness of the magnetic body, as well as the corroded portion. The above provides the magnetic body inspection method of storing the database in the memory included in the magnetic body inspection apparatus 1. Alternatively, the database itself can be stored in a memory provided in a different device such as a memory provided to the personal computer or an externally provided memory.

A magnetic body inspection method according to a third embodiment of the present invention is executed with use of the magnetic body inspection apparatus 1 including the magnet 10, and the magnetic sensor 20 configured to output an electric signal. The magnetic body inspection method includes: acquiring an electric signal for a first spot from the magnetic sensor 20 (step U1); shifting the magnetic sensor 20 from the first spot to a second spot (step U2); acquiring an electric signal for the second spot from the magnetic sensor 20 (step U3); and outputting a difference between the electric signal for the first spot and the electric signal for the second spot (step U4).

Step U1 involves acquiring an electric signal for the first spot from the magnetic sensor 20. The first spot preferably enables acquisition of the electric signal in the state where the magnetic body exists. More specifically, the first spot preferably enables measurement of the state where at least part of the magnetic field 12 of the magnet 10 converges at the magnetic body.

Step U2 involves shifting the magnetic sensor 20 from the first spot to the second spot. The second spot has only to be different from the first spot, but preferably enables acquisition of an electric signal in the state where the magnetic body does not exist. More specifically, the second spot preferably enables measurement of the state where the magnetic field 12 of the magnet 10 does not converge at the magnetic body. In the state where the magnetic field 12 of the magnet 10 does not converge at the magnetic body, the magnetic field has the reference magnetic force lines.

Step U3 involves acquiring an electric signal for the second spot from the magnetic sensor 20.

Step U4 involves outputting the difference between the electric signal for the first spot and the electric signal for the second spot.

According to the above embodiment, the first spot enables measurement of the magnetic field in the state where the magnetic body exists, and the second spot enables measurement of the magnetic field in the state where the magnetic body does not exist. Alternatively, the first spot enables measurement of the magnetic field in the state where the magnetic body does not exist, and the second spot enables measurement of the magnetic field in the state where the magnetic body exits.

The magnetic body inspection method may include disposing the magnetic sensor 20 at the first spot (step U0) before acquiring the electric signal for the first spot from the magnetic sensor 20 (step U1).

The magnetic body inspection apparatus used to execute the magnetic body inspection method has only to include one or more magnetic sensors 20. For example, the method can include acquiring the electric signal for the first spot with use of the single magnetic sensor 20 (step U1), shifting the magnetic sensor 20 from the first spot to the second spot (step U2), and acquiring the electric signal for the second spot (step U3). According to a different embodiment, a plurality of magnetic sensors 20 may each execute step U1, step U2, and step U3. In the case where the plurality of magnetic sensors 20 is provided, the magnetic sensors 20 preferably have the first spots different from each other, and the second spots different from each other. Such a configuration achieves higher inspection accuracy by the magnetic body inspection method.

The magnetic body inspection method preferably includes step U5 of amplifying the difference between the electric signal for the first spot and the electric signal for the second spot. For example, step U5 of amplifying the difference can be executed prior to step U4. That is, the difference between the electric signal acquired at the first spot and the electric signal acquired at the second spot can be amplified and then outputted. For example in this case, the magnetic body inspection apparatus 1 can include the arithmetic processor 32 functioning as the difference detector 30, such that the arithmetic processor 32 coverts, to digital signals, the electric signal for the first spot acquired from the magnetic sensor 20 in step U1 and the electric signal for the second spot acquired from the magnetic sensor 20 in step U3, to calculate and amplify the difference between the digital signals. According to a different embodiment, step U5 of amplifying the difference can be executed simultaneously with step U4. That is, the difference between the electric signal for the first spot acquired from the magnetic sensor 20 in step U1 and the electric signal for the second spot acquired from the magnetic sensor 20 in step U3 can be amplified and outputted simultaneously. This embodiment is preferred in that simultaneously executing step U5 and step U4 shortens time necessary for inspection. For example in this case, the magnetic body inspection apparatus 1 can include the differential amplifier circuit 31 functioning as the difference detector 30, such that the differential amplifier circuit 31 simultaneously receives the electric signal for the first spot acquired from the magnetic sensor 20 in step U1 and the electric signal for the second spot acquired from the magnetic sensor 20 in step U3, to amplify the difference between the signals in accordance with a constant coefficient and simultaneously output the difference thus amplified. In this manner, the magnetic body inspection method includes step U5 of amplifying the difference between the electric signal for the first spot and the electric signal for the second spot, for higher accuracy in inspection of the magnetic body.

As described above, the magnetic body inspection method according to the third embodiment of the present invention includes outputting the difference between the electric signal for the first spot and the electric signal for the second spot to specify where a magnetic body exists in a nonmagnetic body, and whether or not the magnetic body is broken.

The magnetic body inspection method can include step U6 of fitting the difference between the electric signal acquired from the magnetic sensor 20 at the first spot and the electric signal acquired from the magnetic sensor 20 at the second spot, with the database stored in the memory included in the magnetic body inspection apparatus 1. For example, the difference between the electric signal outputted from the magnetic sensor 20 at the first spot and the electric signal outputted from the magnetic sensor 20 at the second spot is measured for the reference sample in the state where the reference sample and the magnetic sensor have the distance C2 therebetween, and the database stored in the memory has only to store the thickness C1 of the reference sample, the distance C2 between the reference sample and the magnetic sensor, and the difference associated with one another. Step U6 involves fitting the difference between the electric signal acquired in step U1 and the electric signal acquired in step U3 with use of the magnetic body inspection apparatus 1 actually applied to the inspection target, with the database stored in the memory. The thickness of the reference sample and the distance between the reference sample and the magnetic sensor associated with the difference data on the database can be obtained from a result of fitting between the difference and the database in step U6, so as to identify the thickness of the magnetic body as the inspection target and the distance between the magnetic body as the inspection target and the magnetic sensor. Fitting according to a different embodiment can be executed in accordance with a method with reference to a model function. There is prepared a model function F1 enabling database fitting, and the model function F1 is set such that fitting parameters D1 and D2 of the model function are determined uniquely with respect to C1 and C2. Furthermore, modeling is executed by preparing model functions F21 and F22 such that D1 and D2 become functions of C1 and C2, respectively. The inspection target is measured to obtain a result that is fitted to obtain the parameters D1 and D2. The parameters are inversely operated with reference to the model functions F21 and F22 to determine C1 and C2.

Such fitting may be executed by an arithmetic processor or a controller further included in the magnetic body inspection apparatus 1. The above provides the magnetic body inspection apparatus 1 including the memory storing the database. Alternatively, the database itself can be stored in a memory provided in a different device such as a memory provided to the personal computer or an externally provided memory.

As described above, the magnetic body inspection method according to the third embodiment of the present invention includes outputting the difference between the electric signal for the first spot and the electric signal for the second spot, and fitting the difference with the database, to specify a position and thickness of the magnetic body existing in a nonmagnetic body, a distance between the magnetic body and the magnetic sensor, a corroded portion, and whether or not the magnetic body is broken.

The magnetic body inspection method also achieves identification of a corroded portion in accordance with the difference obtained from the magnetic body as the inspection target, the distance between the magnetic body and the magnetic sensor, and the thickness. It is accordingly possible to identify the distance between the magnetic body and the magnetic sensor, the thickness of the magnetic body, a broken portion, as well as the corroded portion.

This application claims the benefit of the priority date of Japanese patent application No. 2020-100072 filed on Jun. 9, 2020. All of the contents of the Japanese patent application No. 2020-100072 filed on Jun. 9, 2020 are incorporated by reference herein.

REFERENCE SIGNS LIST

1: magnetic body inspection apparatus
10: magnet
11: gravity center
12: magnetic field
20: magnetic sensor
21: first magnetic sensor
22: second magnetic sensor
30: difference detector
31: differential amplifier circuit
32: arithmetic processor
40: personal computer
50: power source unit
60: display unit
70: inspection target
71: reinforcing bar
72: concrete structure
L1: line segment connecting first magnetic sensor and magnet
L2: line segment connecting second magnetic sensor and magnet

The invention claimed is:

1. A magnetic body inspection apparatus comprising:
a magnet;
a first magnetic sensor disposed at a first predetermined position relative to the magnet and configured to output a first electric signal; and
a second magnetic sensor disposed at a second predetermined position that is different from the first predetermined position relative to the magnet and configured to output a second electric signal;
wherein the magnetic body inspection apparatus is configured to output a difference between the first electric signal outputted from the first magnetic sensor and the second electric signal outputted from the second magnetic sensor, and
the first and second magnetic sensors are disposed at points symmetrically positioned with respect to a gravity center of the magnet.

2. The magnetic body inspection apparatus according to claim 1, wherein a distance between the first magnetic sensor and the magnet is equal to a distance between the second magnetic sensor and the magnet.

3. The magnetic body inspection apparatus according to claim 1, wherein the magnet is a permanent magnet.

4. The magnetic body inspection apparatus according to claim 1, wherein each of the magnetic sensors is a Hall sensor.

5. The magnetic body inspection apparatus according to claim 1, the magnetic body inspection apparatus further comprising a differential amplifier circuit connected to the first magnetic sensor and the second magnetic sensor.

6. The magnetic body inspection apparatus according to claim 1, the magnetic body inspection apparatus configured to inspect a reinforcing bar buried in a concrete structure.

7. A magnetic body inspection method executed with use of a magnetic body inspection apparatus including
a magnet,
a first magnetic sensor disposed at a first predetermined position relative to the magnet and configured to output a first electric signal, and
a second magnetic sensor disposed at a second predetermined position that is different from the first predetermined position relative to the magnet and configured to output a second electric signal,
wherein the first and second magnetic sensors are disposed at points symmetrically positioned with respect to a gravity center of the magnet,
the magnetic body inspection method comprising:
acquiring the first electric signal from the first magnetic sensor;
acquiring the second electric signal from the second magnetic sensor; and
outputting a difference between the first electric signal and the second electric signal.

8. A magnetic body inspection method executed with use of a magnetic body inspection apparatus including
a magnet, and
a magnetic sensor configured to output an electric signal, the magnetic body inspection method comprising:

a step T1 of acquiring a first electric signal from the magnetic sensor in a state where a magnetic body exists as an inspection target;

a step T2 of acquiring a second electric signal from the magnetic sensor in a state where the magnetic body does not exist; and a step T3 of outputting a difference between the first electric signal acquired in the step T1 and the second electric signal acquired in the step T2.

9. A magnetic body inspection method executed with use of a magnetic body inspection apparatus including a magnet, and a magnetic sensor configured to output an electric signal, the magnetic body inspection method comprising:

acquiring a first electric signal for a first spot from the magnetic sensor;

shifting the magnetic sensor from the first spot to a second spot;

acquiring a second electric signal for the second spot from the magnetic sensor; and outputting a difference between the first electric signal for the first spot and the second electric signal for the second spot.

* * * * *